United States Patent
Brcka et al.

(10) Patent No.: US 7,591,935 B2
(45) Date of Patent: Sep. 22, 2009

(54) ENHANCED RELIABILITY DEPOSITION BAFFLE FOR IPVD

(75) Inventors: Jozef Brcka, Loundonville, NY (US); Rodney L. Robison, East Berne, NY (US)

(73) Assignee: Tokyo Electron Limited, Tokyo (JP)

( * ) Notice: Subject to any disclaimer, the term of this patent is extended or adjusted under 35 U.S.C. 154(b) by 585 days.

(21) Appl. No.: 11/302,768

(22) Filed: Dec. 14, 2005

(65) Prior Publication Data

US 2007/0131544 A1     Jun. 14, 2007

(51) Int. Cl.
  *C23C 14/35* (2006.01)
(52) U.S. Cl. .................... 204/298.11; 204/298.06; 118/723 I; 118/723 IR; 156/345.48; 156/345.49
(58) Field of Classification Search .......... 204/298.06, 204/298.11; 118/723 I, 723 IR; 156/345.48, 156/345.49
See application file for complete search history.

(56) References Cited

U.S. PATENT DOCUMENTS

| | | | |
|---|---|---|---|
| 6,251,241 B1 * | 6/2001 | Shin et al. .............. | 204/298.11 |
| 6,287,435 B1 | 9/2001 | Drewery et al. | |
| 6,471,830 B1 * | 10/2002 | Moslehi et al. ........ | 204/192.12 |
| 6,719,886 B2 | 4/2004 | Drewery et al. | |
| 2003/0079838 A1 * | 5/2003 | Brcka .................... | 156/345.48 |
| 2003/0159782 A1 | 8/2003 | Brcka | |
| 2004/0129221 A1 | 7/2004 | Brcka et al. | |

* cited by examiner

*Primary Examiner*—Rodney G McDonald
(74) *Attorney, Agent, or Firm*—Wood, Herron & Evans, L.L.P.

(57) ABSTRACT

Enhanced reliability and performance stability of a deposition baffle is provided in ionized physical vapor deposition (iPVD) processing tool in which a high density plasma is coupled into a chamber from an external antenna through a dielectric window. A deposition baffle with slots protects the window. The deposition baffle has slots through it. The width of the slots at the window side of the baffle is different from the width of the slots at the plasma side of the baffle. Preferably, the ratio of width of the slots at the window side is preferably less than the width at the plasma side. The slots have sidewalls at the plasma side that are arc spray coated. The ratio of the baffle thickness to slot width, or the slot's aspect ratio, is less than 8:1, and preferably less than 6:1. The deposition baffle is spaced less than 1 mm from the window, and preferably less than 0.5 mm from the window.

10 Claims, 4 Drawing Sheets

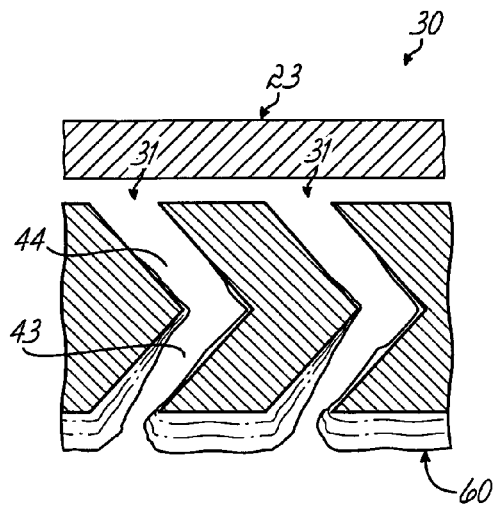
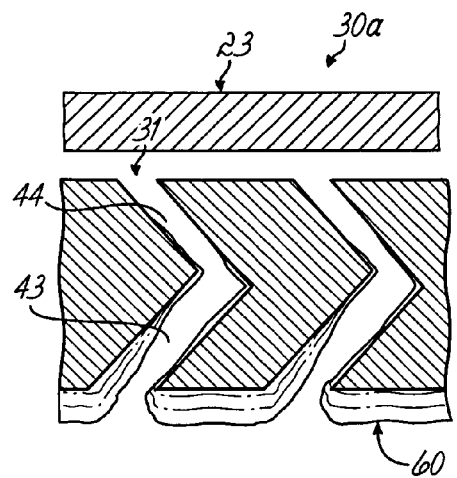
FIG. 4A  FIG. 4B
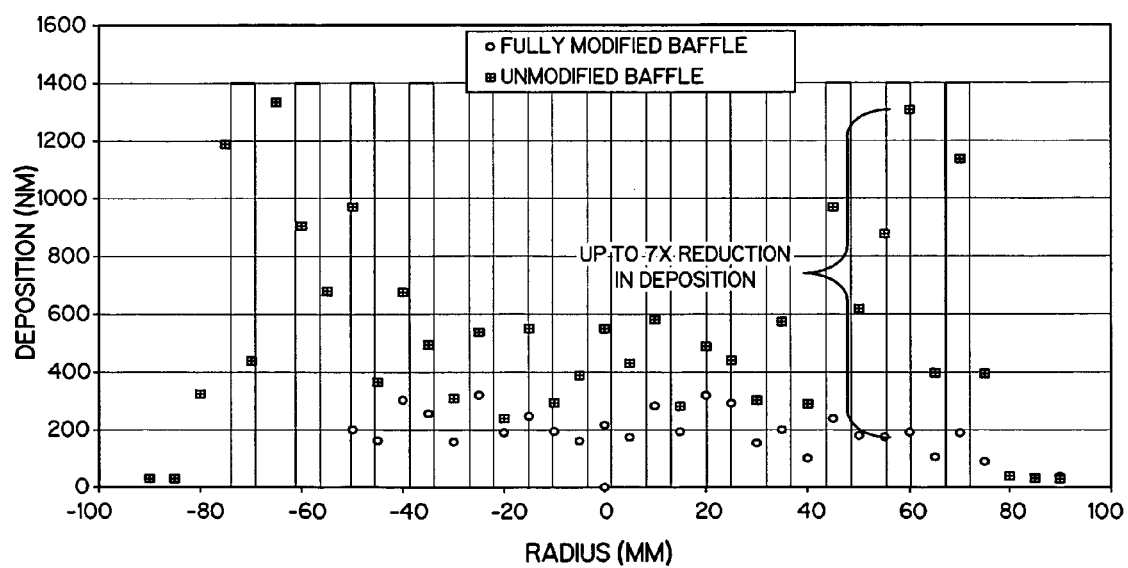
FIG. 5

US 7,591,935 B2

ENHANCED RELIABILITY DEPOSITION BAFFLE FOR IPVD

This invention relates to ionized physical vapor deposition (iPVD), and particularly, to baffles for protecting a dielectric window in iPVD hardware.

BACKGROUND OF THE INVENTION

During fabrication of microelectronic devices, thin films and metal alloys are deposited on substrates and used as electrical conductors, adhesion layers and diffusion barriers. Ionized PVD has been utilized in semiconductor processing for metallization and interconnects, and promises to be useful to extend feature coverage performance up to submicron technology. IPVD often uses an inductively coupled plasma (ICP) for ionizing metal coating material. Chemical vapor deposition (CVD) and atomic layer deposition (ALD) also utilize metallic precursors to deposit metallic layers over structure, and also often use ICP to achieve ionization. ICP frequently is created by coupling energy from an external antenna through a dielectric window into a chamber. The RF transparent dielectric window must be protected from metallic deposits. Deposition baffles are used for this purpose. Such baffles must protect the window while maintaining RF transparency to energy from the antenna. Failure to protect the window can cause the window to fail.

For instance, the increased metal on the dielectric window will reduce the window's transparency to RF magnetic field from antenna, reduce RF power transfer into the plasma, and eventually, cause excessive heat within the deposited coating at the window. This will cause non-uniform heating of the dielectric window, inducing thermal stress in dielectric material that, in combination with mechanical stress, can cause the window to fail. In addition to hardware failure, RF power transferred into the plasma can decrease and reduce the efficiency of the plasma to ionize atoms. This loss of efficiency could result in changes of material properties deposited on the substrate, for example, deposition rate, feature coverage and uniformity. These changes are undesirable for process stability.

Therefore, enhanced performance of the deposition baffle to protect the dielectric window during the lifetime of deposition baffle is needed.

SUMMARY OF THE INVENTION

An objective of the present invention is to provide enhanced performance of the deposition baffle to protect the dielectric window during the lifetime of the deposition baffle. Another objective is to provide stable process results over the lifetime of the deposition baffle and dielectric window.

According to the principles of the present invention, a deposition baffle is provided for protecting a dielectric window in the wall of a vacuum deposition chamber while facilitating coupling of RF energy through the window and baffle into the processing chamber to form a high density plasma therein. The baffle has a body formed of electrically conductive material with a plurality of slots extending through the body. The widths of the slots differ between the side of the body facing the window and the side facing the plasma.

In certain embodiments, the slots are narrower on the window side of the baffle than on the plasma side of the baffle, thereby restricting passage of material from the plasma to the dielectric window and allowing the wider slots on the plasma side to receive a buildup of material without materially changing RF transparency through the window, thereby providing more stable operation over the life of the baffle.

In the preferred embodiment, the slots have a plasma side portion that extends at an angle from the plasma side of the body and a window side portion that extends at an angle from the window side of the body, with the portions joining at an angle near the center of the body forming chevron shaped slots.

In certain embodiments, the plasma side portion of each slot has sidewalls that are arc spray coated or otherwise treated to increase adhesion of coating material thereto.

The slots have aspect ratios, that is ratios of slot length through the baffle to slot width at the narrowest point, of less than eight, and preferably not more than about six.

Preferably, the baffle is mounted less than one millimeter from the dielectric window inside of the chamber, for example, between 0.5 millimeters to 0.9 millimeters from the window.

These and other objects and advantages of the present invention will be more readily apparent from the following detailed description of illustrated embodiments of the invention.

BRIEF DESCRIPTION OF THE DRAWINGS

FIG. 4A is a cross-sectional view through the baffle of FIG. 2A showing a buildup of coating material on a baffle of the prior art.

FIG. 4B is a cross-sectional view, similar to FIG. 4A, through the baffle of FIG. 2B showing a buildup of coating material on a baffle of the present invention.

FIG. 5 is a graph comparing deposition rates of material on a dielectric window with the baffles of FIGS. 2A and 2B.

DETAILED DESCRIPTION

Deposition baffles of the type used to protect dielectric windows in iPVD processing systems are disclosed in U.S. Pat. Nos. 6,287,435 and 6,719,886 and in U.S. Patent Application Publications Nos. 2003/0159782 and 2004/0129221, hereby expressly incorporated herein by reference.

Figure 1:
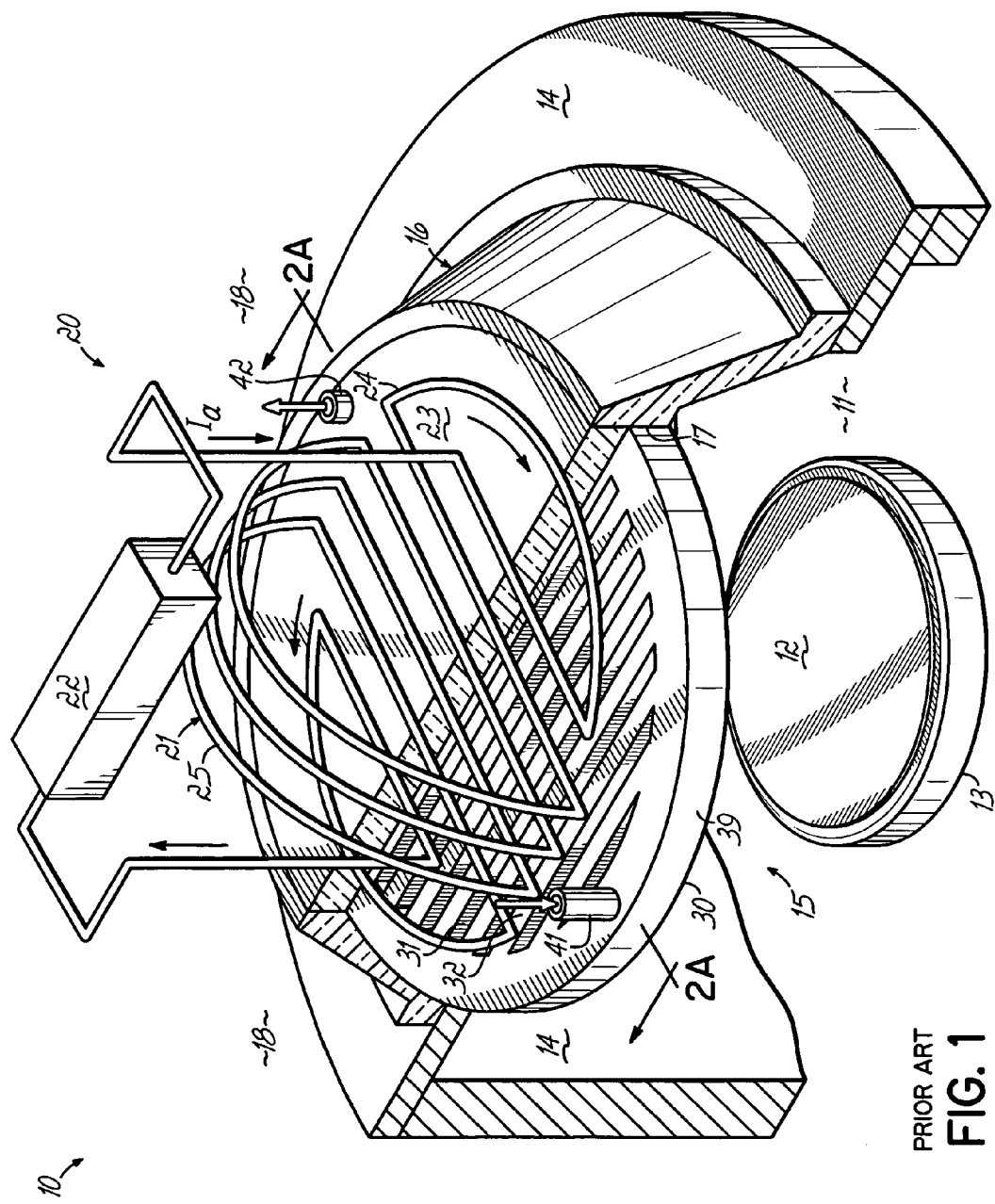
FIG. 1 is a cut-away perspective view of an iPVD apparatus illustrating components of the prior art.

The invention is described in the context of an iPVD apparatus 10 of the type disclosed in U.S. Pat. No. 6,287,435, as diagrammatically illustrated in FIG. 1. The apparatus 10 includes a vacuum chamber 11 bounded by a chamber wall 14 and having a semiconductor wafer 12 supported for processing therein on an upwardly facing substrate support 13. An ionized sputter material source 15 is situated in the top of the chamber 11 and includes a frusto-conical magnetron sputtering target 16 with an RF energy source 20 situated in an opening 17 in the center of the target 16. The source 20 includes an RF coil or antenna 21 connected to the output of an RF power supply and matching network 22. The coil 21 is located in atmosphere 18 outside of the chamber 11, behind a dielectric window 23 that forms a part of the wall 14 of the chamber 11, which isolates a processing gas maintained at a vacuum inside of the chamber 11 from the atmosphere outside of the chamber 11.

Inside of the window 23 is a deposition baffle 30 of electrically conductive material having, in the embodiment shown, a plurality of parallel linear slots 31 therethrough. Typically, the baffle 30 is made of solid metal or of metal clad body 39. The body 39 of the baffle 30 includes, between each pair of adjacent slots 31, an elongated slat or rib 32. The coil 21 has a plurality of parallel conductor segments 24 that lie close to the outside of the window 23 and interconnected by return segments 25 configured so that the currents $I_a$ in the segments 24 flow in the same direction and typically perpendicular to the slots 31 of the baffle 30. A cooling fluid channel 40 of FIG. 2A lies within the baffle body 39 and communicates with a cooling fluid inlet 41 and cooling fluid outlet 42 to provide one or more cooling fluid paths between the inlet 41 and outlet 42. The cooling fluid channel 40 extends around a central portion 45 of the body 39. A cooling channel cap 48 covers the peripheral rim of main body part 47 to enclose the channel 40. The channel 40 may extend in a serpentine pattern along each of the ribs 32 between the inlet 41 and outlet 42.

Figure 2A:
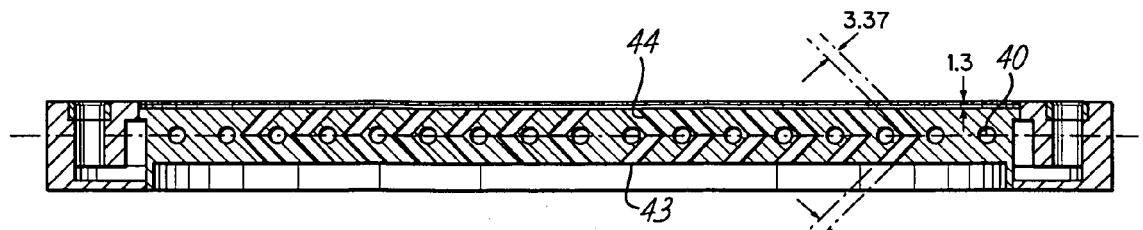
FIG. 2A is a cross-sectional view through the deposition baffle of the iPVD apparatus of FIG. 1 taken at line 2A-2A.

The slots 31 are of chevron-shaped cross section with ribs 32 of the body extending between each adjacent slot pair. The slots 31 are milled in straight lines into the central body portion 45, in two halves 43 and 44, from opposite sides of the body 39. One slot half 43 is cut from the plasma side of the body 39 while the other 44 is cut from the window side of the body 39. The slot halves 43 and 44 are inclined at angles of 45 degrees to the surface of the body 39 and at right angles to each other, intersecting at approximately the middle plane of the body 39, as shown in FIG. 2A. In the prior art baffle 30, the slot halves 43 and 44 are of the same width, for example, 3.37 millimeters.

Figure 3:
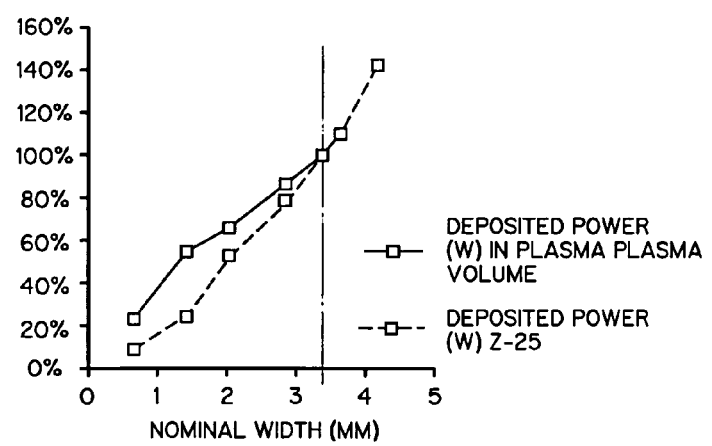
FIG. 3 is graph of a simulated process with the apparatus of FIG. 1 showing the relative change in deposited power into a plasma through a baffle as a function of slot width.

The penetration of metal inside the slots 31 and further onto the dielectric window 23 is reduced with reduction of the slot width. On the other hand, reducing slot width also reduces the RF transparency of the deposition baffle 30, as illustrated in the graph of FIG. 3. A compromise in a slot size considers that a larger slot width is required to provide good RF transparency, but a smaller slot width is required to minimize particle transmission through the individual slots 31. An aspect ratio ("effective slot length" through the baffle to "slot width") preferably does not exceed 8:1 for good RF transparency, and more preferably is less than about 6:1.

These ratios change over the life of the baffle. As illustrated in FIG. 4A, with the baffle 30, a buildup of material 60 on the plasma side of the baffle 30 eventually restricts the width of the plasma side slot halves 43 of the slots 31.

Figure 2B:
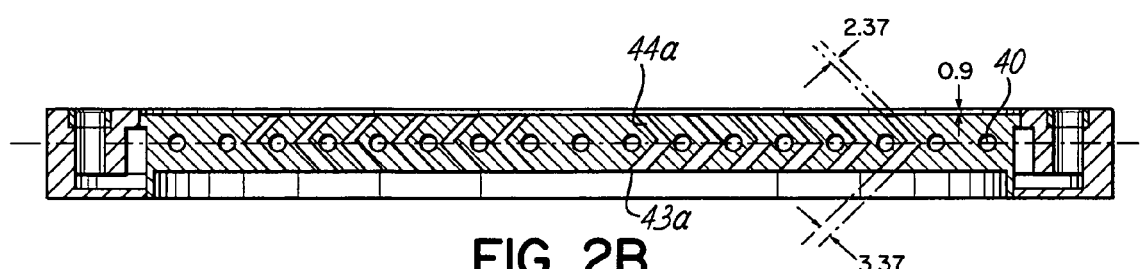
FIG. 2B is a cross-sectional view, similar to FIG. 2A, through a deposition baffle according to an embodiment of the present invention.

The deposition baffle 30a according to an embodiment of the present invention is illustrated in cross section in FIG. 2B. In the baffle 30a, the width of the slots 31 varies along the length of the slots. In the embodiment shown, the plasma side slot halves 43 are the same width as in the baffle 30, but the width of the window side slot halves 44 is reduced. In the illustrated example, the reduction in width is about one millimeter.

Figure 6A:
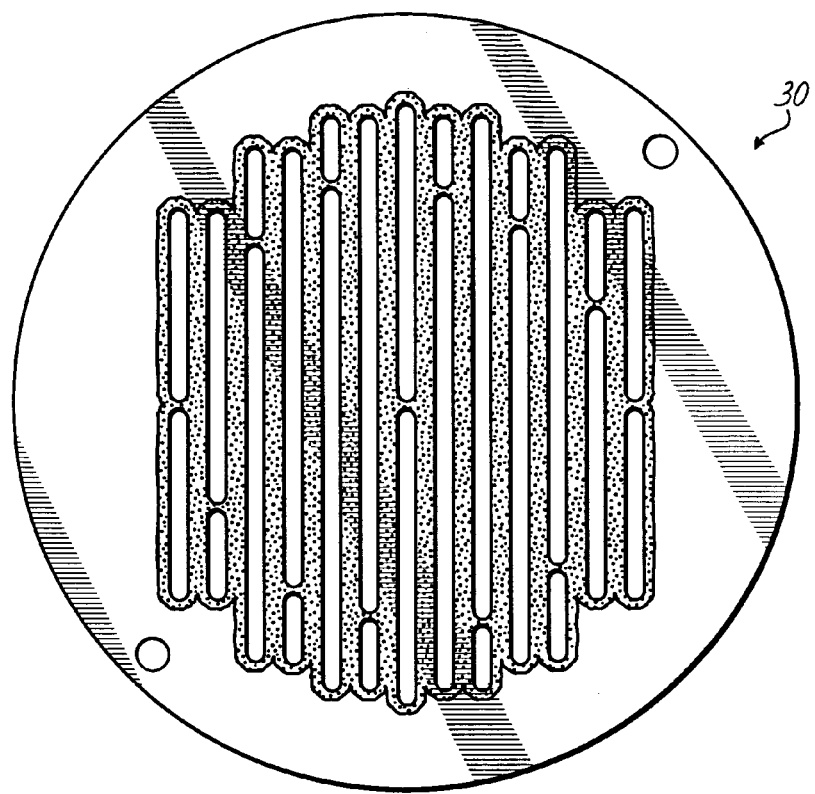
FIG. 6A is a perspective view of the baffle of FIG. 2A showing a buildup of coating material on a baffle of the prior art.
Figure 6B:
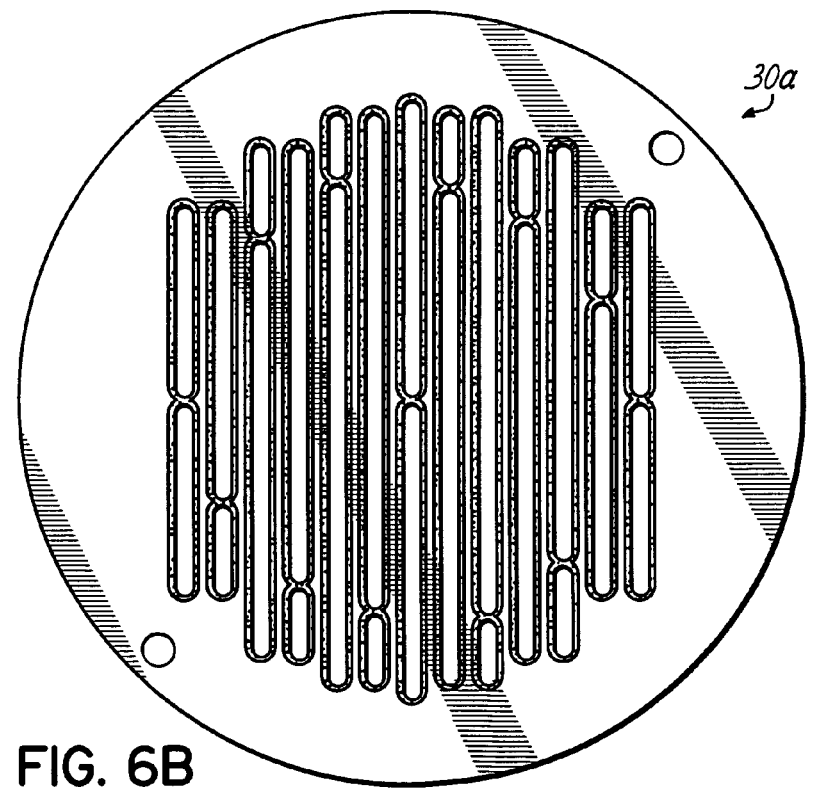
FIG. 6B is a perspective view, similar to FIG. 6A, of the baffle of FIG. 2B, showing a buildup of coating material on a baffle of the present invention.

A baffle having the features of the baffle 30a improves the performance of the deposition baffle 30, extends the lifetime of the dielectric window 23, reduces the failure rate of the window 23 due to thermal load, and provides more stable process results over the lifetime of the deposition baffle. For example, the deposition rate of material onto the window 23 using the deposition baffle 30a is lower than with baffles 30 of the prior art, as illustrated in the graph of FIG. 5. A significant reduction of window temperature rise over the life of the baffle results. As can be seen also from FIG. 6B, the amount of deposition and extent of the deposition pattern on the window are significantly reduced, with no metal continuity between individual deposition patterns surrounding the individual slots 31 in the baffle 30a. As a result, the window 23 remains transparent to RF energy. Process stability significantly improves without major impact on the iPVD processes.

Preferred geometry, from the point of potential deposition on the window 23, includes slot geometry that consists of a combination of two or more different width values. Preferably, a smaller slot width is provided at the window side of the deposition baffle 30a, for example, with slot halves 44 narrower than slot halves 43. In an operating pressure range of from 5 mTorr to 100 mTorr, the transport of metal within slots 31 is in the transitional viscous-molecular flow regime, and metal to wall collision frequency is comparable to or higher than the volume gas collision frequency. Metal transparency can be further reduced when the plasma side slot halves 43 are arc spray coated or otherwise treated for better adhesion thereto of the deposited material penetrating into the slot 31.

The different combined slot widths have another advantage from the process stability point of view. The RF transparency at the beginning of the lifetime of the baffle 30a is determined by the slot aspect ratio, which is the ratio of the minimal slot width to the effective length of the slot 31. During the deposition lifetime of the baffle 30a, deposition of material on the plasma side of the baffle 30a reduces the effective width of the slot 31, as shown in FIG. 4. This has an impact on RF power transparency over the lifetime of the deposition baffle 30 with slots 31 having constant width, because this aspect ratio and the RF transparency of the slot 31 is reduced. This will cause unstable and drifting conditions of the process. However, using slots with a minimal width at the window side of the deposition baffle 30a, such as in the slot halves 44, the effective aspect ratio of the slot 31 at the beginning of the deposition baffle lifetime is determined by the width of the slot halves 44. When the deposition occurs on the plasma side of the deposition baffle 30a, the effective aspect ratio is not initially affected, because the starting slot width was larger at the plasma side of the deposition baffle 30a than the minimum width at the window side that defines the effective aspect ratio of the slots 31, as illustrated in FIG. 4B. With the baffle 30a, significantly more stable process parameters are observed than with the deposition baffle 30 having slots 31 of constant width.

Another dimension affecting performance is the size of the gap or spacing between dielectric window 23 and deposition baffle 30, 30a. Experimental results show significant reduction in metal deposits onto the window 23 when the baffle 30a is closer to the window 23. With such spacing, the continuity of the deposited film is interrupted, allowing RF transparency of the window 23 and reducing thermal heat due to ohmic losses within coating on the window 23. These facts completely eliminate window failure when the gap between the baffle 30a and the window 23 is less than 1 mm, and preferably about 0.5 mm.

With the above dimensions, deposition rate to the window is significantly decreased, up to seven times, and therefore thermal loss from RF through deposited metal on the window 23 is significantly decreased, which increases the window thermal budget and reduces the probability of window breakage. Further, etch profile appears unchanged or is less dished. Additionally, changing to the baffle of the present invention has little impact on processes previously developed with the prior art baffle.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A deposition baffle for protecting a dielectric window in the wall of a vacuum chamber of an ionized physical vapor deposition system while facilitating inductive coupling therethrough from an antenna outside of the chamber into a plasma within a vacuum chamber, the baffle comprising:
    a body formed of electrically conductive material having a window side and a plasma side and a plurality of slots extending through the body between the window side and the plasma side;
    each of the slots of the plurality having a single slot opening on the plasma side of the body and a single slot opening on the window side of the body, each slot opening having a width; and
    the widths of the slot openings on the window side of the body being less than the widths of the slot openings on the plasma side of the body.

2. The baffle of claim 1 wherein:
    each slot opening on the plasma side extends at an angle of about 45 degrees from the plasma side of the body and each slot opening on the window side extends at an angle of about 45 degrees from the window side of the body and joins a slot opening on the plasma side at an angle of about 90 degrees near the center of the body to form a slot having a transverse cross section that has a chevron shape.

3. The baffle of claim 1 wherein:
    each slot opening on the plasma side extends at an angle from the plasma side of the body and each slot opening on the window side extends at an angle from the window side of the body and joins a slot opening on the plasma side at an angle near the center of the body to form a slot having a transverse cross section that has a chevron shape.

4. The baffle of claim 3 wherein:
    each slot opening on the plasma side of the body has sidewalls that are arc spray coated.

5. The baffle of claim 1 wherein:
    each of the slots has a path length from the plasma side to the window side that is less than eight times the width of the slot opening on the window side.

6. The baffle of claim 1 wherein:
    each of the slots has a path length from the plasma side to the window side that is less than six times the width of slot opening on the window side.

7. A deposition baffle for protecting a dielectric window in the wall of a vacuum chamber while facilitating inductive coupling from an antenna through the baffle and into the chamber, the baffle comprising:
    a body formed of electrically conductive material having a plurality of slots extending through the body between opposite sides of the body;
    each of the slots of the plurality having a single slot opening on a first side of the body and a single slot opening on a second side of the body, each slot opening having a width; and
    the widths of the slot openings on the first side of the body being less than the widths of the slot openings on the second side of the body;
    the sides of each of the slots of the plurality on the second side of the body being treated to increase adhesion of a coating material thereto.

8. A plasma source comprising the baffle of claim 7 and further comprising:
    a dielectric window spaced from the deposition baffle a distance of less than one millimeter;
    the width of the slot openings of each slot being narrower on the side of the baffle facing the window.

9. A semiconductor wafer processing apparatus comprising:
    a vacuum processing chamber enclosed in a chamber wall having a dielectric window therein;
    a sputtering target in the vacuum processing chamber;
    a substrate support in the vacuum processing chamber;
    an RF energy source outside of the vacuum processing chamber and coupled to the vacuum processing chamber through the dielectric window;
    a deposition baffle inside of the vacuum processing chamber and spaced from the dielectric window by a distance of less than one millimeter;
    the deposition baffle having a window side facing the window, a plasma side facing the vacuum processing chamber, and a plurality of slots therethrough,
    each of the slots of the plurality having a single slot opening on the plasma side of the body and a single slot opening on the window side of the body, each slot opening having a width; and
    the widths of the slot openings on the window side of the body being less than the widths of the slot openings on the plasma side of the body.

10. The plasma processing apparatus of claim 9 wherein:
    each of the slots has a chevron shaped cross section.

* * * * *

UNITED STATES PATENT AND TRADEMARK OFFICE
CERTIFICATE OF CORRECTION

PATENT NO. : 7,591,935 B2
APPLICATION NO. : 11/302768
DATED : September 22, 2009
INVENTOR(S) : Brcka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 867 days.

Signed and Sealed this

Fourteenth Day of December, 2010

David J. Kappos
*Director of the United States Patent and Trademark Office*